United States Patent
Tien et al.

(10) Patent No.: US 7,623,350 B2
(45) Date of Patent: Nov. 24, 2009

(54) THERMAL CONDUCTING MEDIUM PROTECTOR

(75) Inventors: Chi-Wei Tien, Taipei (TW); Chang-Yuan Wu, Taipei (TW); Ching-Ya Tu, Taipei (TW)

(73) Assignee: Compal Electronics, Inc., Taipei (TW)

( * ) Notice: Subject to any disclaimer, the term of this patent is extended or adjusted under 35 U.S.C. 154(b) by 433 days.

(21) Appl. No.: 11/692,926

(22) Filed: Mar. 29, 2007

(65) Prior Publication Data

US 2008/0024995 A1 Jan. 31, 2008

(30) Foreign Application Priority Data

Jul. 31, 2006 (TW) .............................. 95127925 A

(51) Int. Cl.
*H05K 7/20* (2006.01)
*H01L 23/34* (2006.01)
*F28F 7/00* (2006.01)

(52) U.S. Cl. ........................ 361/719; 361/704; 361/705; 361/709; 257/718; 257/719; 24/458; 24/459; 24/520; 165/185; 165/80.2; 165/134.1

(58) Field of Classification Search .................. 361/697, 361/704, 707, 709, 719; 257/718, 719, E23.103; 174/16.1, 16.3; 24/458, 459, 520; 165/80.2, 165/80.3, 185
See application file for complete search history.

(56) References Cited

U.S. PATENT DOCUMENTS

| 6,935,420 | B1* | 8/2005 | Dong et al. | 165/185 |
| 6,952,348 | B2* | 10/2005 | Wu | 361/719 |
| 7,051,790 | B2* | 5/2006 | Lin | 165/80.2 |
| 7,063,136 | B2* | 6/2006 | Yu et al. | 165/185 |
| 7,068,514 | B2* | 6/2006 | Chang et al. | 361/705 |
| 7,365,983 | B2* | 4/2008 | Huang et al. | 361/704 |
| 2006/0268513 | A1* | 11/2006 | Sheng et al. | 361/695 |
| 2008/0289797 | A1* | 11/2008 | Shen et al. | 165/80.2 |
| 2009/0067133 | A1* | 3/2009 | Li et al. | 361/709 |

* cited by examiner

*Primary Examiner*—Jayprakash N Gandhi
*Assistant Examiner*—Zachary M Pape
(74) *Attorney, Agent, or Firm*—Jianq Chyun IP Office

(57) ABSTRACT

A thermal conducting medium protector is applicable for being assembled to a carrier, so as to protect a thermal conducting medium disposed on the carrier. The thermal conducting medium protector includes a shell and a cover plate. The shell has a first buckling portion on one side of the shell, and an opening. When the carrier is placed on a side surface of the shell, the thermal conducting medium is located in the opening. The cover plate has a second buckling portion, a first side, on which the second buckling portion is located, and a second side opposite to the first side and pivoted to the shell. When the cover plate rotates along the second side and then span across the carrier placed on the side surface of the shell, the buckling portions are buckled with each other to hold the carrier between the shell and the cover plate.

6 Claims, 4 Drawing Sheets

THERMAL CONDUCTING MEDIUM PROTECTOR

CROSS-REFERENCE TO RELATED APPLICATION

This application claims the priority benefit of Taiwan application serial no. 95127925, filed Jul. 31, 2006. All disclosure of the Taiwan application is incorporated herein by reference.

BACKGROUND OF THE INVENTION

1. Field of the Invention

The present invention relates to a protector. More particularly, the present invention relates to a thermal conducting medium protector.

2. Description of Related Art

During the operation of a computer, several of the operational elements generate a considerable amount of heats. As the processing speed of the computer increases, the central processing unit (CPU) generates even greater heats. The heat generated by the CPU is usually dissipated by attaching a heat dissipation device with fins to the bare chip of the CPU, such that the heat is transferred from the chip to the heat dissipation device, and then dissipated into the open air by the fins.

To make the heat dissipation device and the CPU closely contact with each other to enhance the thermal conducting efficiency, a thermal conducting medium, for example, thermal grease, is usually disposed between the heat dissipation device and the bare chip. To facilitate the transportation, the heat dissipation device applied with the thermal grease must be assembled with a thermal conducting medium protector, so as to protect the integrity of the thermal grease from being damaged before the heat dissipation device is assembled to the CPU.

FIG. 1A is a perspective view of a conventional thermal conducting medium protector jointed to a heat dissipation device, and FIG. 1B is a cross-sectional view taken along the line I-I in FIG. 1A. Referring to FIG. 1A and FIG. 1B together, a conventional thermal conducting medium protector 100, disclosed in Taiwan Patent Publication No. 358565, includes a cover 110 and a retaining fringe 120. The cover 110 is located on the center of the thermal conducting medium protector 100 and has a protection space 122, and the retaining fringe 120 is connected around the cover 110. The conventional thermal conducting medium protector 100 is fixed to a bottom surface 200a of a heat dissipation device 200 via a fixing unit (not shown), and the protection space 122 is used to accommodate a thermal grease 210 applied onto the heat dissipation device 200. The fixing unit is, for example, a bonder, such as a double sided tape, an adhesive and the like. The conventional thermal conducting medium protector 100 further includes a stripping portion 130, such that the conventional thermal conducting medium protector 100 is stripped off from the heat dissipation device 200 before being assembled to the CPU (not shown).

FIG. 2 is a perspective view of another conventional thermal conducting medium protector before being jointed to a heat dissipation device. Referring to FIG. 2, a conventional thermal conducting medium protector 300, disclosed in Taiwan Patent Publication No. M277035, includes a cover plate 310 and a connecting plate 320. The cover plate 310 is connected to the connecting plate 320 along a folding line 302, and the cover plate 310 and the connecting plate 320 are suitable for being folded together along the folding line 302, such that the cover plate 310 is covered on the connecting plate 320. The connecting plate 320 has four first joint portions 322, and the cover plate 310 has four second joint portions 312. When the cover plate 310 is covered on the connecting plate 320, the first joint portions 322 are respectively corresponding to the second joint portions 312, and the first joint portion 322 are suitable for being buckled with the second joint portions 312 respectively, such that the cover plate 310 is retained on the connecting plate 320. The connecting plate 320 further has a hollow portion 324. Similarly, the conventional thermal conducting medium protector 300 is fixed to the bottom surface 200a of the heat dissipation device 200 via a fixing unit (not shown), and the hollow portion 324 is used to accommodate the thermal grease 210 applied to the heat dissipation device 200. The fixing unit is, for example, a bonder, such as a double sided tape, an adhesive, and the like.

Accordingly, as known from the two cases disclosed above, the conventional thermal conducting medium protector fixed via a bonder is not secure. Moreover, when the conventional thermal conducting medium protector is removed from the heat dissipation device, it may easily damage the heat dissipation device or the thermal conducting medium. For example, when the conventional thermal conducting medium protector is removed from the heat dissipation device, a portion of the bonder is remained on the heat dissipation device, thus affecting the heat dissipation effect of the heat dissipation device. Moreover, if the thermal conducting medium protector falls off when being detached due to carelessness, the integrity of the thermal conducting medium may be easily affected.

SUMMARY OF THE INVENTION

The present invention is directed to a thermal conducting medium protector, which is assembled to a carrier to protect the integrity of the thermal conducting medium disposed on the carrier.

The present invention is further directed to a thermal conducting medium protector, which is firmly held onto the carrier via a mechanical buckling structure, and is easy to be detached from the carrier.

As embodied and broadly described herein, the present invention provides a thermal conducting medium protector, applicable for being assembled to a carrier, so as to protect a thermal conducting medium disposed on a surface of the carrier. The thermal conducting medium protector includes a shell and a cover plate. The shell has a first buckling portion, an opening, a first side surface, and a second side surface opposite to the first side surface. The first buckling portion is located on one side of the shell. When the carrier is placed on the first side surface of the shell, the thermal conducting medium is located in the opening. The cover plate has a second buckling portion, a first side, and a second side opposite to the first side. The second buckling portion is located on the first side, and the second side is pivoted to the shell. When the carrier is placed on the first side surface of the shell, the cover plate rotates along the second side and spans across the carrier, and the second buckling portion is buckled with the first buckling portion to hold the carrier between the shell and the cover plate.

In an embodiment of the present invention, one of the first buckling portion and the second buckling portion is a hook, and the other of the first buckling portion and the second buckling portion is a hook hole.

In an embodiment of the present invention, the shell further comprises a positioning portion, protruding from the second side surface and suitable for being engaged into a socket opening of a socket, so as to position the shell onto the socket.

In an embodiment of the present invention, a distance between the first side surface and the second side surface is about 1.5-2.5 cm.

In an embodiment of the present invention, a distance between the first side surface and the second side surface is about 1.9-2.1 cm.

In an embodiment of the present invention, the shell and the cover plate are integrally formed.

In an embodiment of the present invention, the thermal conducting medium protector further comprises a flexible portion connected between the shell and the cover plate, and the cover plate is pivoted to the shell via the flexible portion.

The thermal conducting medium protector of the present invention adopts a mechanical buckling structure, so the thermal conducting medium protector is not only firmly assembled to the carrier, but also can be easily detached. Furthermore, when assembling the thermal conducting medium protector, the positioning portion can be inserted into the socket opening, so as to prevent the thermal conducting medium protector from sliding too much with respect to the socket. In addition, the thermal conducting medium protector is covered on the socket after being assembled, thereby protecting plugholes in the socket from being blocked by foreign substances.

In order to make the aforementioned and other objectives, features, and advantages of the present invention comprehensible, embodiments accompanied with figures are described in detail below.

DESCRIPTION OF EMBODIMENTS

Figure 1A:
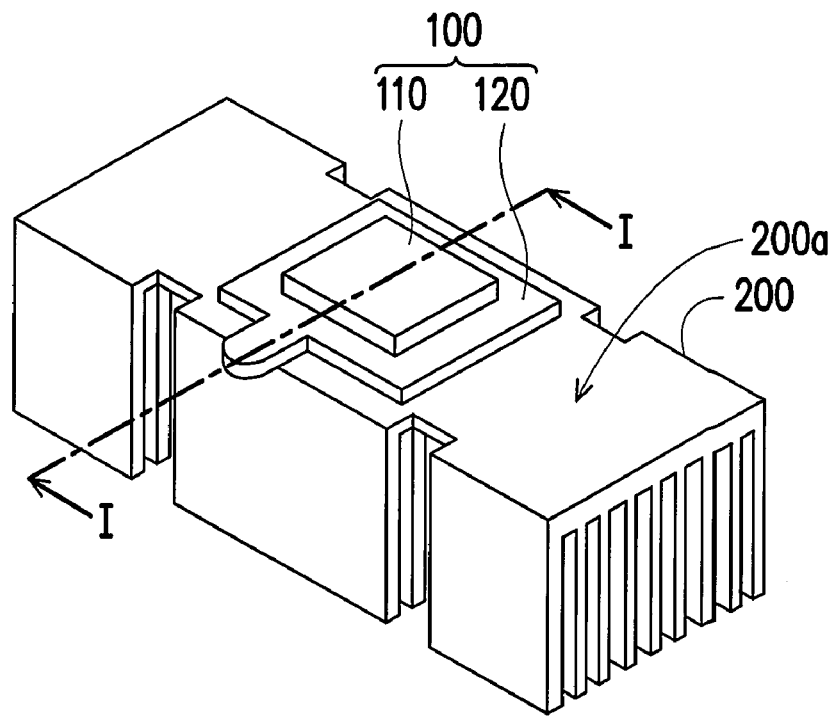
FIG. 1A is a perspective view of a conventional thermal conducting medium protector jointed to a heat dissipation device.
Figure 1B:
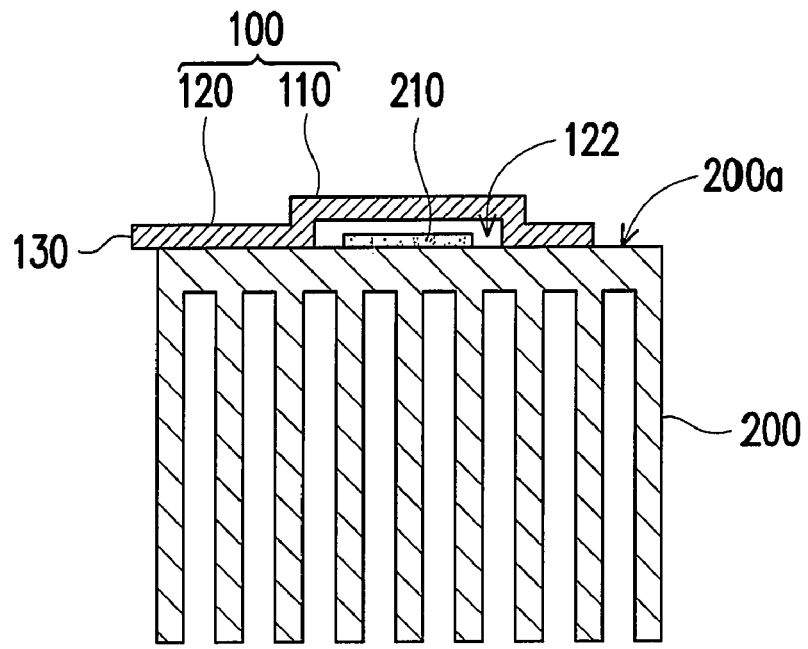
FIG. 1B is a cross-sectional view of FIG. 1A taken along the line I-I.
Figure 2:
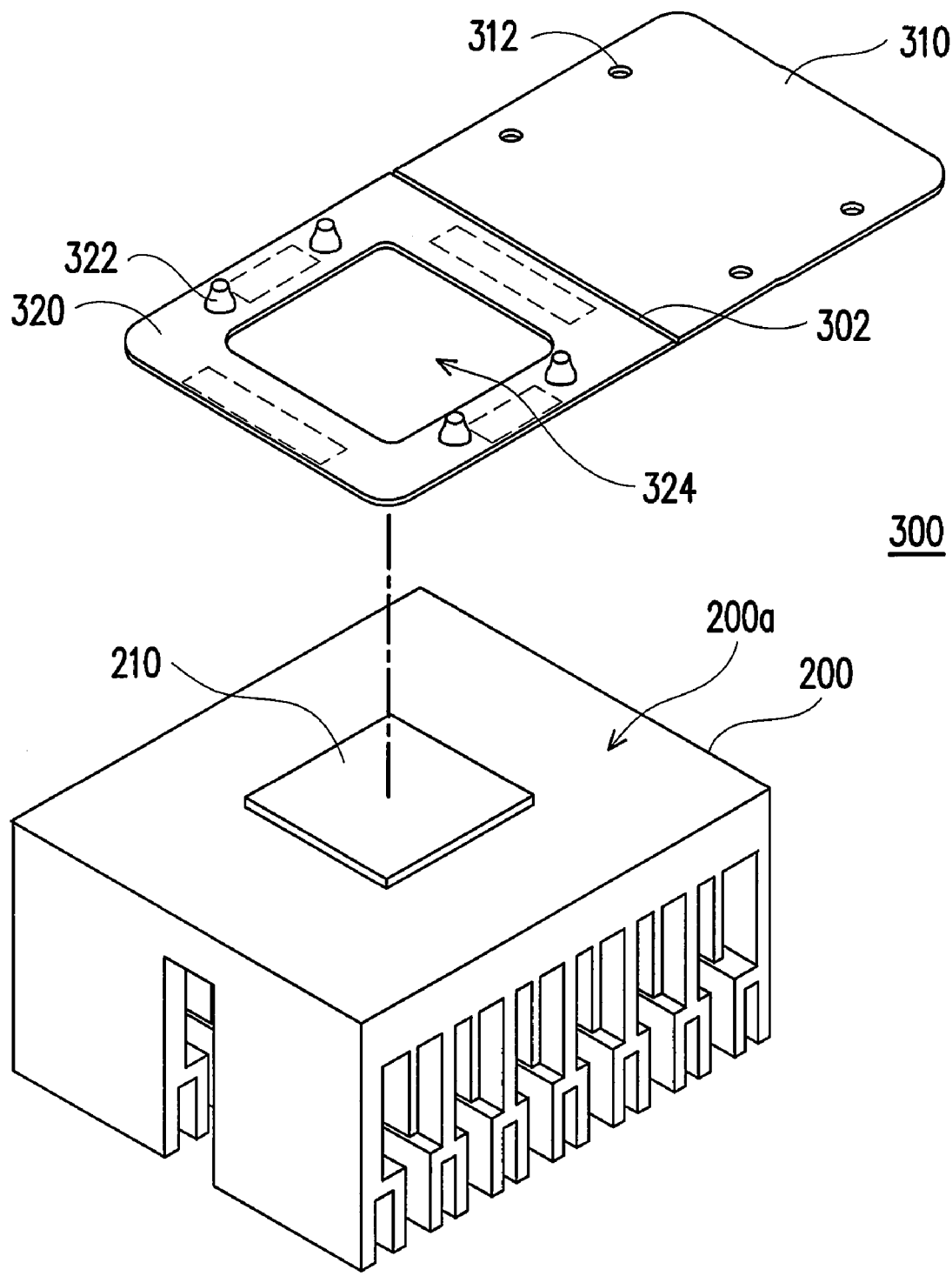
FIG. 2 is a perspective view of another conventional thermal conducting medium protector before being jointed to a heat dissipation device.
Figure 3A:
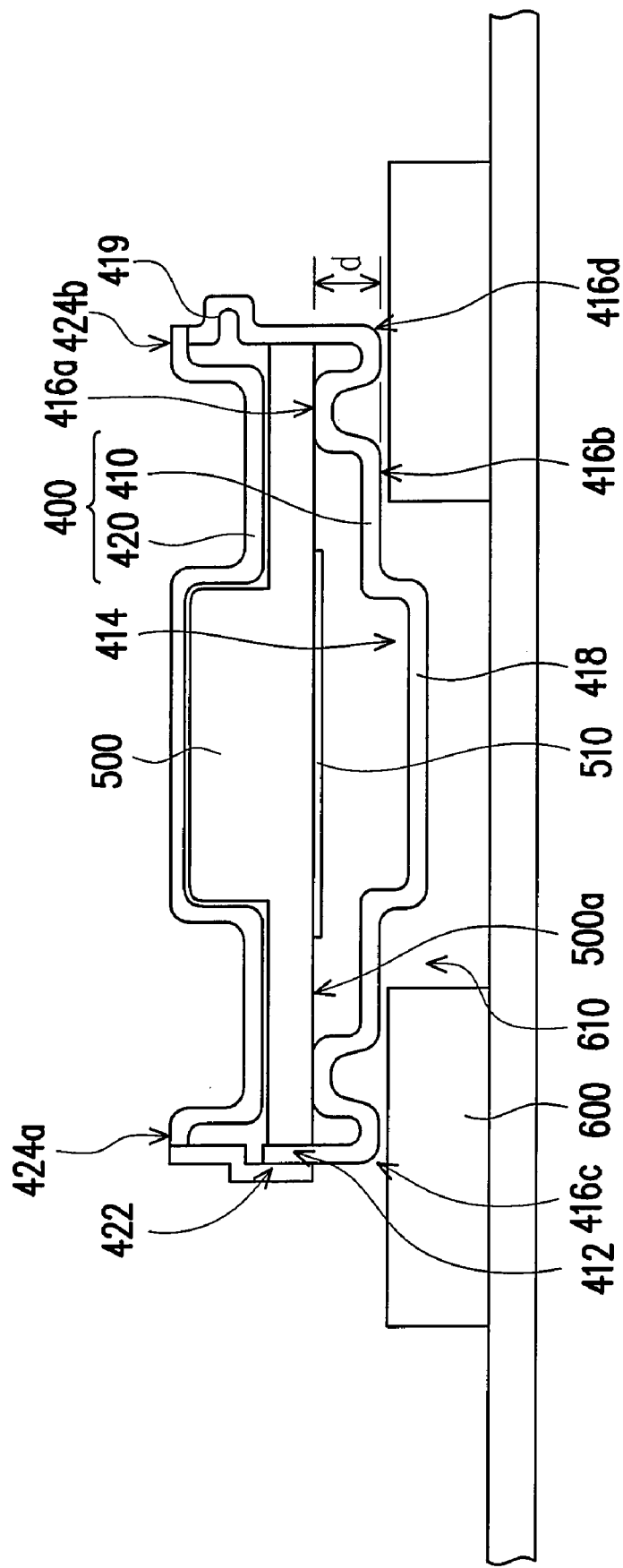
FIG. 3A illustrates a thermal conducting medium protector assembled to a carrier according to an embodiment of the present invention.
Figure 3B:
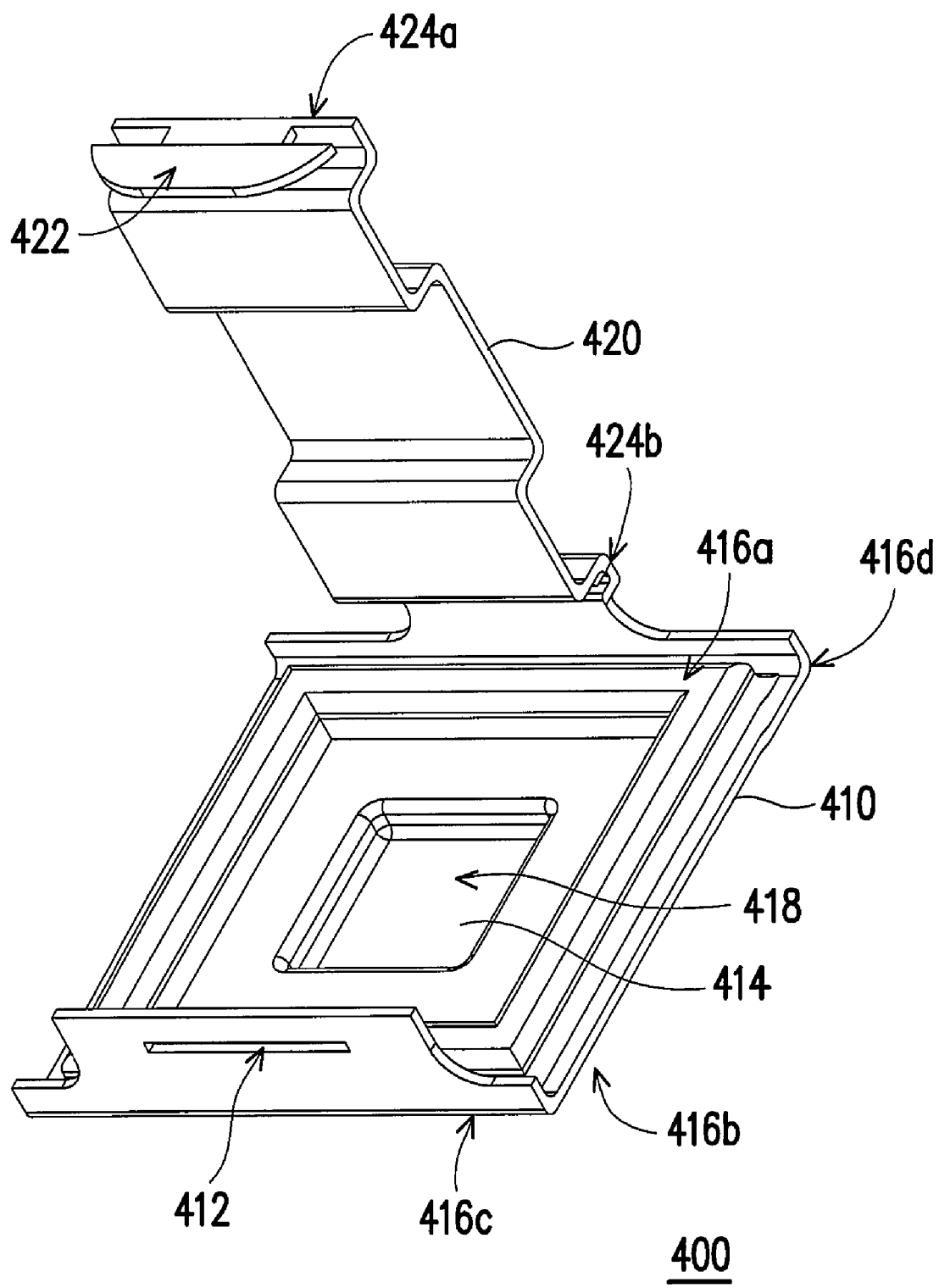
FIG. 3B is a perspective view of a thermal conducting medium protector in FIG. 3A before the first buckling portion is buckled with the second buckling portion.

FIG. 3A illustrates a thermal conducting medium protector assembled to a carrier according to an embodiment of the present invention, and FIG. 3B is a perspective view of a thermal conducting medium protector in FIG. 3A before the first buckling portion is buckled with the second buckling portion. Referring to FIG. 3A and FIG. 3B, a thermal conducting medium protector 400 is applicable for being assembled to a carrier 500, so as to protect a thermal conducting medium 510 disposed on a surface 500a of the carrier 500.

In this embodiment, the carrier 500 is, for example, a heat dissipation device, a heat block, a heat pipe, or another means with a thermal conducting function, and the thermal conducting medium 510 is, for example, thermal grease, thermal conducting tape, or another thermal conducting medium suitable for conducting heats. Moreover, the thermal conducting medium protector 400 is suitable for cladding the carrier 500 and the thermal conducting medium 510, so as to protect the thermal conducting medium 510 disposed on the carrier 500.

The thermal conducting medium protector 400 includes a shell 410 and a cover plate 420. The shell 410 has a first buckling portion 412, an opening 414, a first side surface 416a, and a second side surface 416b. The first side surface 416a is opposite to the second side surface 416b, and the first buckling portion 412 is located on one side 416c of the shell 410.

Furthermore, the cover plate 420 has a second buckling portion 422, a first side 424a, and a second side 424b. The first side 424a is opposite to the second side 424b, and the second buckling portion 422 is located on the first side 424a. The second side 424b is pivoted to one side 416d of the shell 410, and the side 416d is opposite to the side 416c. The cover plate 420 and the shell 410 are suitable for pivotally rotating relative to each other along the second side 424b, so as to clothe the carrier 500 and the thermal conducting medium 510.

Therefore, when the carrier 500 is placed on the first side surface 416a of the shell 410 as shown in FIG. 3A, the thermal conducting medium 510 is located in the opening 414. Next, the cover plate 420 pivotally rotates relative to the shell 410 along the second side 424b, so as to enable the cover plate 420 to span across the carrier 500. Afterward, the second buckling portion 422 is buckled with the first buckling portion 412, so as to hold the carrier 500 between the shell 410 and the cover plate 420, and to retain the thermal conducting medium 510 in the opening 414.

In this embodiment, the first buckling portion 412 is, for example, a hook hole, the second buckling portion 422 is, for example, a hook, and the first buckling portion 412 and the second buckling portion 422 are buckled with each other. However, the present invention is not limited to this embodiment. For example, the first buckling portion 412 can be a hook, the second buckling portion 422 can be a hook hole, and the first buckling portion 412 and the second buckling portion 422 are buckled with each other. Alternatively, the first buckling portion 412 and the second buckling portion 422 can also be formed by other buckling elements that are suitable for being buckled together.

In this embodiment, the shell 410 and the cover plate 420 are, for example, integrally formed.

Referring to FIG. 3A and FIG. 3B, the shell 410 can further include a positioning portion 418 protruding from the second side surface 416b. The positioning portion 418 is suitable for being engaged into a socket opening 610 of a socket 600, so as to position the shell 410 onto the socket 600.

In this embodiment, the socket 600 is, for example, a CPU socket disposed on a mainboard of a computer, and the socket opening 610 is, for example, an opening of the CPU socket. Moreover, the socket 600 usually has a plurality of plugholes (not shown) for the pins of the CPU to be plugged therein. Since the thermal conducting medium protector 400 is covered on the socket 600, it can protect the plugholes of the socket 600.

Furthermore, the first side surface 416a is spaced apart from the second side surface 416b by a distance d, which is preferably 1.5-2.5 cm, and more preferably, 1.9-2.1 cm. Thus, when the thermal conducting medium protector 400 is engaged into a slot of the CPU socket, the distance d is used for preserving a space for mounting the CPU. However, the present invention is not limited to being applied to a CPU, but can be used in other electronic elements that require to clothe the carrier 500 and the thermal conducting medium 510, and meanwhile require to preserve a mounting space.

In this embodiment, the thermal conducting medium protector 400 can further include a flexible portion 419, connected between the shell 410 and the cover plate 420, and the cover plate 420 is, for example, pivoted to the shell 410 via the flexible portion 419. Therefore, due to the flexibility of the flexible portion 419, the thermal conducting medium protector 400 is applicable for carriers 500 with various thicknesses. Moreover, the thermal conducting medium protector 400 can more closely clothe the carrier 500 and the thermal conducting medium 510 between the shell 410 and the cover plate 420, so as to prevent the carrier 500 from falling off before being assembled to an electronic element, and thus avoiding affecting the integrity of the thermal conducting medium 510.

To sum up, the thermal conducting medium protector of the present invention is applicable for being assembled to a carrier, so as to protect the thermal conducting medium disposed on the carrier. Besides, the shell and the cover plate are jointed together by means of mechanical buckling the first buckling portion with the second buckling portion, so the thermal conducting medium protector not only can be firmly assembled to the carrier, but also can be easily detached.

Moreover, when the thermal conducting medium protector is engaged into a socket opening of the socket, the positioning portion of the thermal conducting medium protector can be inserted into the socket opening, so as to prevent the thermal conducting medium protector from sliding too much with respect to the socket. In addition, the thermal conducting medium protector is covered on the socket after being assembled, thereby protecting the plugholes in the socket from being blocked by foreign substances. Furthermore, the distance between the first side surface and the second side surface of the shell can be used to preserve a space for mounting an electronic element.

Though the present invention has been disclosed above by the preferred embodiments, they are not intended to limit the present invention. Those of ordinary skill in the art can make some modifications and variations without departing from the spirit and scope of the present invention. Therefore, the protecting range of the present invention falls in the appended claims.

What is claimed is:

1. A thermal conducting medium protector, applicable for being assembled to a carrier to protect a thermal conducting medium disposed on a surface of the carrier, comprising:

a shell, having a first buckling portion, an opening, a first side surface, and a second side surface opposite to the first side surface, wherein the first buckling portion is located on one side of the shell, and when the carrier is placed on the first side surface of the shell, the thermal conducting medium is located in the opening; and a cover plate, having a second buckling portion, a first side, and a second side opposite to the first side, wherein the second buckling portion is located on the first side, the second side includes a flexible portion, connected between the shell and the cover plate, wherein the cover plate is pivoted to the shell via the flexible portion, and after the carrier is placed on the first side surface of the shell, the cover plate rotates along the second side and then spans across the carrier, and the second buckling portion is buckled with the first buckling portion to hold the carrier between the shell and the cover plate.

2. The thermal conducting medium protector as claimed in claim 1, wherein one of the first buckling portion and the second buckling portion is a hook, and the other of the first buckling portion and the second buckling portion is a hook hole.

3. The thermal conducting medium protector as claimed in claim 1, wherein the shell further comprises a positioning portion, protruding from the second side surface and suitable for being engaged into a socket opening of a socket, so as to position the shell on the socket.

4. The thermal conducting medium protector as claimed in claim 1, wherein a distance between the first side surface and the second side surface is 1.5-2.5 cm.

5. The thermal conducting medium protector as claimed in claim 1, wherein a distance between the first side surface and the second side surface is 1.9-2.1 cm.

6. The thermal conducting medium protector as claimed in claim 1, wherein the shell and the cover plate are integrally formed.

\* \* \* \* \*